United States Patent [19]

Choe

[11] Patent Number: 5,639,682

[45] Date of Patent: Jun. 17, 1997

[54] METHOD OF FORMING A SEMICONDUCTOR DEVICE USING A SELF-ALIGNED CONTACT

[75] Inventor: Hyun-cheol Choe, Seoul, Rep. of Korea

[73] Assignee: Samsung Electronics Co., Ltd., Suwon, Rep. of Korea

[21] Appl. No.: 552,535

[22] Filed: Nov. 3, 1995

Related U.S. Application Data

[62] Division of Ser. No. 281,641, Jul. 28, 1994, Pat. No. 5,583,357.

[30] Foreign Application Priority Data

Jul. 28, 1993 [KR] Rep. of Korea ............... 93-14472

[51] Int. Cl.$^6$ ................ H01L 21/70; H01L 27/00
[52] U.S. Cl. ................ 437/52; 437/60; 437/919
[58] Field of Search ............... 437/47, 52, 60, 437/919

[56] References Cited

U.S. PATENT DOCUMENTS

| | | | |
|---|---|---|---|
| 5,236,859 | 8/1993 | Bae et al. | 437/52 |
| 5,284,787 | 2/1994 | Ahn | 437/52 |
| 5,386,382 | 1/1995 | Ahn | 365/174 |

*Primary Examiner*—Jey Tsai
*Attorney, Agent, or Firm*—Cushman Darby & Cushman, IP Group of Pillsbury Madison & Sutro L.L.P.

[57] ABSTRACT

A semiconductor device using a self-aligned contact and a method for manufacturing the same is disclosed. A gate electrode having a first spacer formed on the sidewalls thereof is formed on a semiconductor substrate. Active regions which are spaced apart from each other by the gate electrode are formed in the semiconductor substrate. A bitline having a second spacer formed on the sidewalls thereof is formed on the gate electrode and the active regions. A self-aligned contact is formed on the active regions and a first pad electrode connected with the active region through the contact is formed between the bitlines. A bitline contact is formed on the bitline, and second and third pad electrodes, which are respectively connected with the bitline and the first pad electrode through the bitline contact, are formed on the bitline. Thus, the alignment tolerances of the bitline contact and the storage-node contact are maximized, so that a reliable semiconductor device can be realized.

7 Claims, 10 Drawing Sheets

FIG. 19A

METHOD OF FORMING A SEMICONDUCTOR DEVICE USING A SELF-ALIGNED CONTACT

This is a division of application Ser. No. 08/281,641, filed Jul. 28, 1994 U.S. Pat. No. 5,583,357.

BACKGROUND OF THE INVENTION

The present invention relates to a semiconductor device and a method for manufacturing the same, and more particularly, to a semiconductor device using a self-aligned contact and a method for manufacturing the same.

Generally speaking, to increase the integration of a semiconductor memory device, research into fields such as lithography, cell structure, new wiring materials, and the physical properties of insulating films becomes essential. Specifically, when increasing the integration of a DRAM device from 4 Mbit to 256 Mbit, it becomes necessary to reduce the size of a contact area of the device along with the cell area reduction.

Though a contact is formed to a minimum feature size, the inadvertent exposure of a peripheral structure, (e.g., a gate electrode or a bitline), frequently occurs due to mask misalignment. Thus, an electrical short may result between the gate electrode and the bitline, between the bitline and a storage node, or between the gate electrode and the storage node, which is a severely detrimental to the reliability of the memory device.

Many methods have been developed for avoiding such an exposure of the peripheral structure due to mask misalignment. One among these is a method for forming a self-aligned contact.

The method for forming a self-aligned contact is one in which the contact is formed using the step differential of a peripheral structure. Since contacts of various sizes are obtained without using a mask according to peripheral structure height, insulating material thickness at the point where the contact hole will be formed, and the etching method, this method is suitable for realizing a highly integrated semiconductor device.

A method for manufacturing a semiconductor device using a self-aligned contact, which is disclosed in German Patent Publication No. 3,910,033 A1, will be explained with reference to FIGS. 1, 2 and 3.

Figure 1:
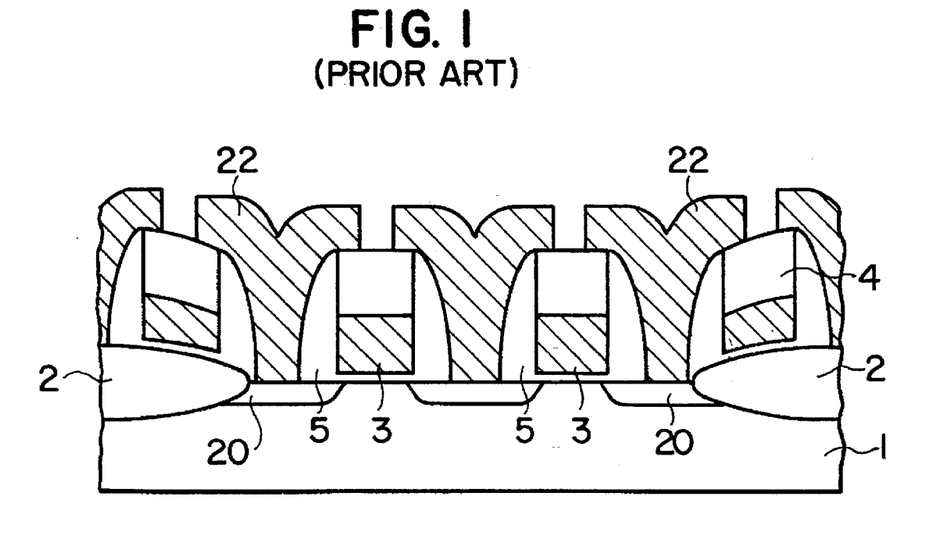
FIGS. 1, 2 and 3 are cross-sectional views for illustrating a method for forming a contact of semiconductor device according to a conventional method.

Referring to FIG. 1, a gate oxide film (not shown) is formed on a semiconductor substrate 1 having a field oxide film 2 formed thereon, and a polycrystalline silicon and an insulating material are sequentially deposited on the gate oxide film. Then, the insulating material layer and the polycrystalline silicon layer are patterned by a lithography process, thereby forming a gate electrode 3 which is capped by an insulating layer 4. Thereafter, an oxide is deposited on the resultant structure wherein gate electrode 3 is formed. The oxide is anisotropically etched to thereby form a spacer 5 on the sidewalls of gate electrode 3 and insulating layer 4. Then, impurity ions are implanted throughout the entire surface of the resultant structure having spacer 5, thereby forming an active region 20 in substrate 1 serving as a source/drain region. Here, the gate oxide film on the surface of substrate 1 is also etched during the anisotropic etching process for forming spacer 5, to thereby form a contact hole (not shown) which is self-aligned by spacer 5. Then, an impurity-doped polycrystalline silicon is deposited on the resultant structure wherein the self-aligned contact is formed, and is patterned by a lithography process, thereby forming a pad electrode 22 which is connected with active region 20 through the self-aligned contact.

Figure 2:
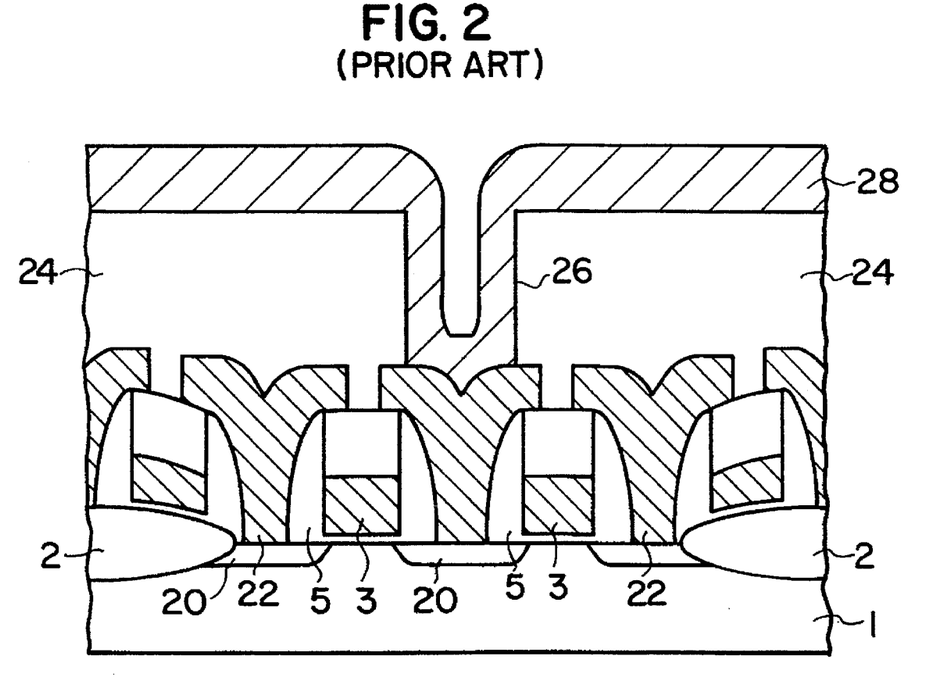

Referring to FIG. 2, an insulating material, e.g., boro-phospho-silicate glass (BPSG), is deposited on the resultant structure wherein pad electrode 22 is formed and is reflowed at a high temperature, thereby forming a first planarizing layer 24. Then, first planarizing layer 24 is selectively etched by a lithography process, thereby forming a bitline contact 26 to expose a pad electrode 22. Thereafter, a conductive material is deposited on the resultant structure wherein bitline contact 26 is formed and is patterned by a lithography process, thereby forming a bitline 28 which is connected with pad electrode 22 through bitline contact 26. Here, pad electrode 22 guards against the creation of a short between gate electrode 3 and bitline 28 during the formation of bitline contact 26.

Figure 3:
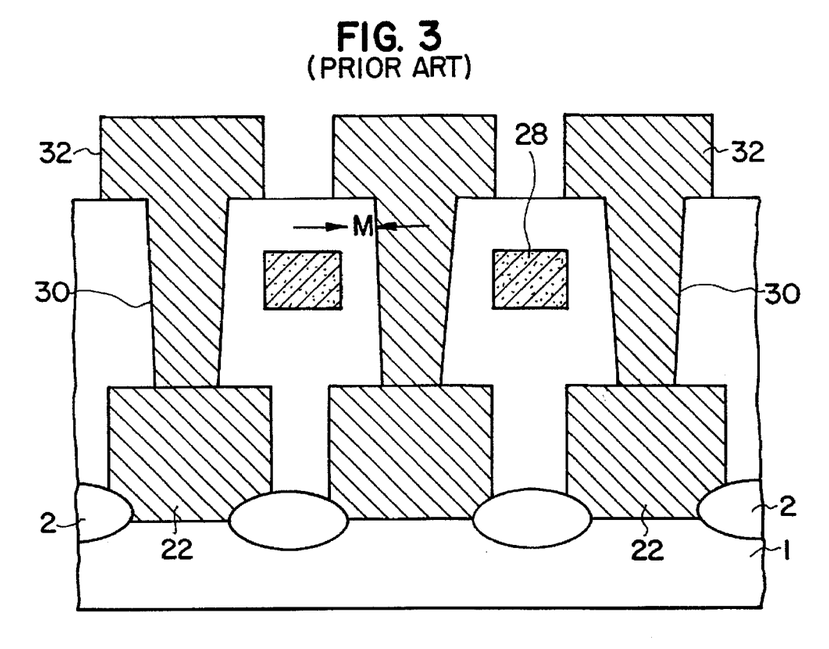

Referring to FIG. 3, an insulating material, e.g., BPSG, is deposited on the resultant structure wherein bitline 28 is formed, and is reflowed to thereby form a second planarizing layer (not shown). Then, the second and first planarizing layers are selectively etched by a lithography process, thereby forming a storage-node contact 30 to expose pad electrode 22. Thereafter, an impurity-doped polycrystalline silicon is deposited on the resultant structure wherein storage-node contact 30 is formed, and is patterned by a lithography process, thereby forming a capacitor storage node 32 which is connected with pad electrode 20 through storage-node contact 30. Here, pad electrode 22 guards against the creation of a short between gate electrode 3 and storage node 32 during the formation of storage-node contact 30.

According to the above-described conventional method, since the insulating layer and the spacer enveloping the gate electrode, and the field oxide film are used as an etch-blocking layer during the formation of the pad electrode, the substrate of the active region may be damaged when the size of the field oxide film is small or when the pad electrode is misaligned. In DRAMs beyond the 64 Mbit capacity, the opposing bird's beaks of the field oxide film meet each other during the oxidation step for field oxide film formation, so that punch-through occurs. Thus, it is very difficult to reduce the size of the active region and increase the size of the field oxide film as desired. Therefore, it is hard to effectively prevent damage to the active region when forming the pad electrode. Also, since the bitline can be aligned to the bitline contact only when the bitline contact is precisely aligned between the gate electrode and the active region, the alignment tolerance of the bitline contact is independent of the size of the pad electrode. Accordingly, the pad electrode cannot help in obtaining a sufficient misalignment margin of the bitline contact. Also, since the storage-node contact is aligned between the bitline and the gate electrode, for preventing a short between the storage node and the bitline, the storage-node contact should be formed with respect to an alignment margin (reference symbol "M" in FIG. 3) with respect to the bitline. Therefore, the pad electrode also cannot contribute to the securing of a sufficient misalignment margin of the storage-node contact.

SUMMARY OF THE INVENTION

To solve the above-described problems, it is an object of the present invention to provide a reliable semiconductor device using a self-aligned contact.

It is another object of the present invention to provide a manufacturing method especially suitable for the manufacture of the above semiconductor device.

To accomplish the above object, there is provided a semiconductor device comprising:

a gate electrode formed on a semiconductor substrate;

active regions formed in the substrate and spaced apart from each other by the gate electrode;

a first spacer formed on the sidewalls of the gate electrode;

a bitline formed on the gate electrode and the active regions;

a second spacer formed on the sidewalls of the bitline;

a contact formed on the active region;

a first pad electrode formed between the bitlines and connected with the active region via the contact;

a bitline contact formed on the bitline; and second and third pad electrodes formed on the bitline, the second pad electrode being connected with the bitline via the bitline contact and the third pad electrode being connected with the first pad electrode via the bitline contact.

According to a preferred embodiment of the present invention, a storage-node contact for connecting a capacitor storage node with the active region is formed on the third pad electrode being connected with the first pad electrode. Therefore, the third pad electrode serves as a pad for forming a storage-node contact.

To accomplish the other object, there is provided a method for manufacturing a semiconductor device comprising the steps of:

forming a gate electrode on a semiconductor substrate;

forming active regions which are spaced apart from each other by the gate electrode in the semiconductor substrate;

forming a first insulating film on the resultant structure wherein the active regions are formed;

forming a bitline on the first insulating film;

forming a second insulating film on the bitline;

forming a first spacer and a second spacer composed of the first insulating film and second insulating film, respectively, on the sidewalls of the gate electrode and the bitline, respectively, and simultaneously, forming a self-aligned contact on the active regions;

depositing a first conductive material on the resultant structure wherein the contact is formed, and etching the first conductive material, to thereby form a first pad electrode which is connected with the active region between the bitlines;

forming a bitline contact on the bitline; and depositing a second conductive material on the resultant structure wherein the bitline contact is formed and patterning the second conductive material by a lithography process, to thereby form a second pad electrode connected with the bitline via the bitline contact and a third pad electrode connected with the first pad electrode via the bitline contact.

According to the present invention, after forming the bitline contact on the bitline, the second pad electrode which connects the bitline with the active region, and the third pad electrode which is used as a pad for forming a storage-node contact are simultaneously formed. Therefore, the margin of misalignment for the bitline contact is independent of the bitline. Also, since the third pad electrode which is a pad for forming a storage-node contact is formed on the bitline, the margin of misalignment for the storage-node contact is independent of the bitline. Accordingly, an alignment tolerance of the storage-node contact can be maximized.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 4A:
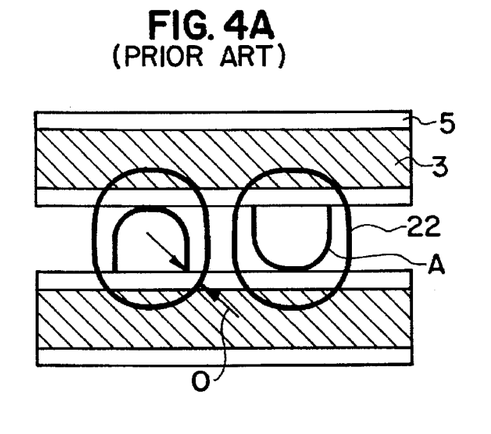
FIGS. 4A and 4B are a plan view and a perspective view, respectively, showing a semiconductor device manufactured according to the conventional method.
Figure 4B:
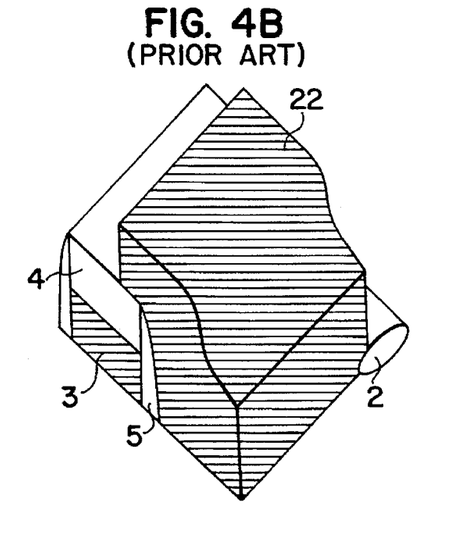
Figures 5A, 5B:
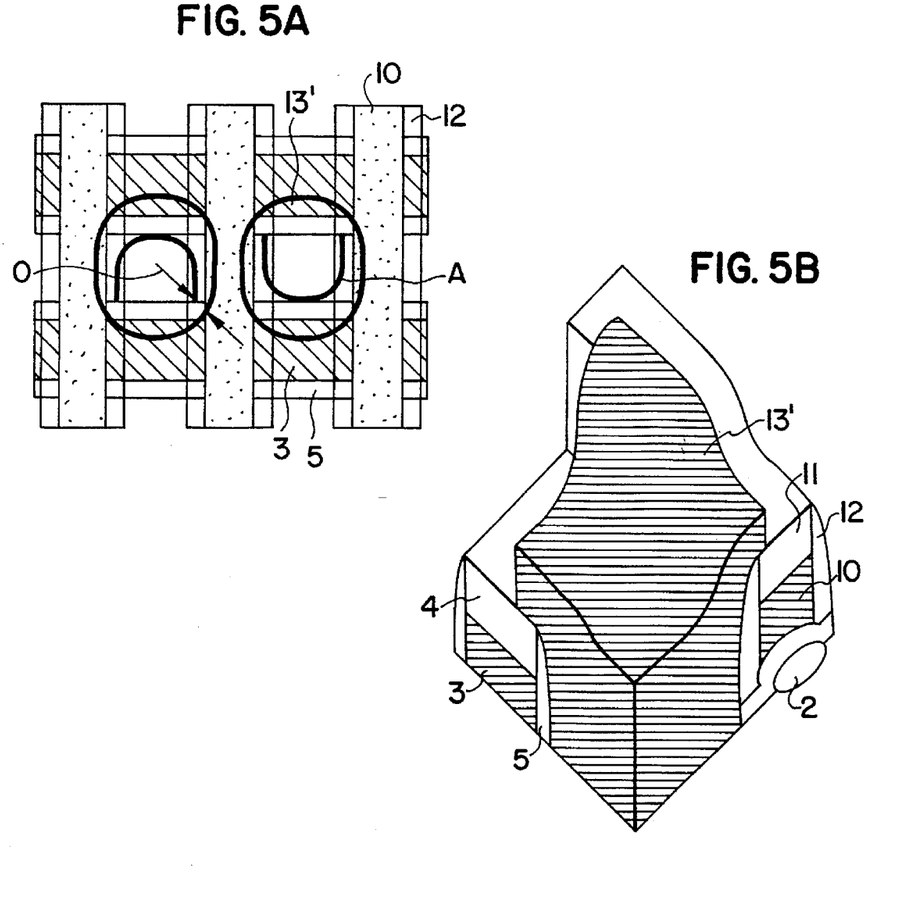
FIGS. 5A and 5B are a plan view and a perspective view, respectively, showing a semiconductor device manufactured according to the present invention.

Plan views and perspective views are respectively shown in FIGS. 4A & 4B, illustrating a semiconductor device manufactured according to the conventional method (described with respect to FIGS. 1, 2 and 3), and in FIGS. 5A & 5B, illustrating that according to the present invention.

Referring to FIGS. 4A and 4B, in the conventional method, spacer 5 is formed on the sidewalls of gate electrode 3 formed on the semiconductor substrate, and pad electrode 22 is connected to the contact (not shown) formed in self-alignment by spacer 5. As shown in FIG. 4A, since pad electrode 22 surrounding an active region (A) is tightly patterned into a slightly oblong circle, an overlapping margin (0) existing between the active region (A) and pad electrode 22 is insufficient. Though this overlapping margin is related to the distance between gate electrodes 3, it is basically dependent on the size of field oxide film 2. Therefore, since it is difficult to increase the size of the field oxide film in DRAMs beyond a 64 Mbit capacity, damage to the active region cannot be effectively prevented when pad electrode 22 is formed according to the conventional method.

Referring to FIGS. 5A and 5B, in the present invention, a first spacer 5 is formed on the sidewalls of a gate electrode 3 formed on a semiconductor substrate, a bitline 10 is formed on gate electrode 3, and a second spacer 12 is formed on the sidewalls of bitline 10. When second spacer 12 is formed, a first pad electrode 13' which is connected with an active region (A) through a contact (not shown) formed in self-alignment to active region (A) is formed between bitlines 10. According to the present invention, a portion of the active region (A) is exposed by bitline 10 and the second spacer 12 on the sidewalls thereof and by gate electrode 3 and the first spacer 5 on the sidewalls thereof. Also, bitline 10 and gate electrode 3 are used as an etch-blocking layer when first pad electrode 13' is formed. Therefore, damage to the active region (A) can be effectively prevented. Also, since first pad electrode 13' is formed after forming bitline 10, an overlapping margin (0) existing between first pad electrode 13' and active region (A) can be sufficiently secured.

Figure 6A:
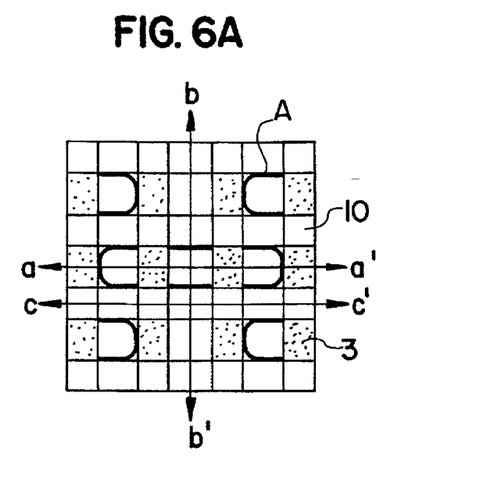
FIGS. 6A and 6B are plan views showing a semiconductor device manufactured according to the present invention.
Figure 6B:
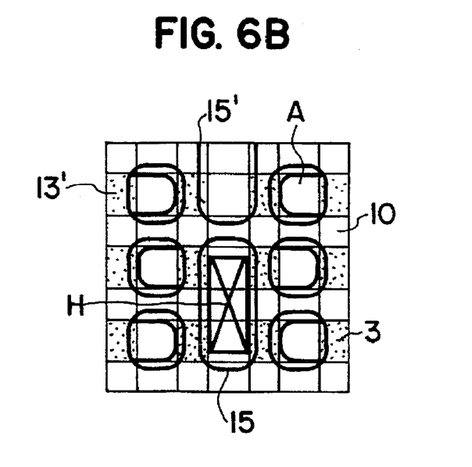
Figure 7A:
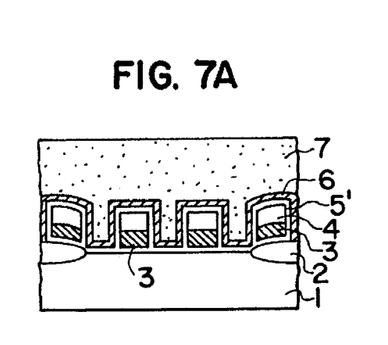
FIGS. 7A–7D, 8A–8D, 9A–9D, 10A–10D, 11A–11D, 12A–12D, 13A–13D, 14A–14D, 15A–15D and FIGS. 16A–16D are cross-sectional views for illustrating a method for manufacturing a semiconductor device according to one embodiment of the present invention.
Figure 7B:
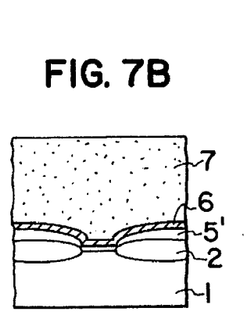
Figure 7C:
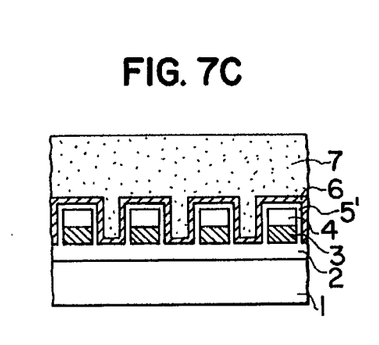
Figure 7D:
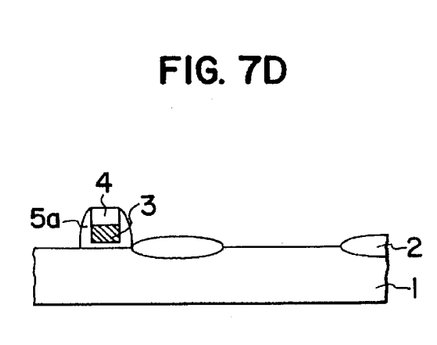
Figure 8A:
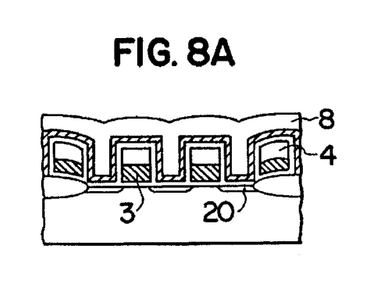
Figures 8B, 8C:
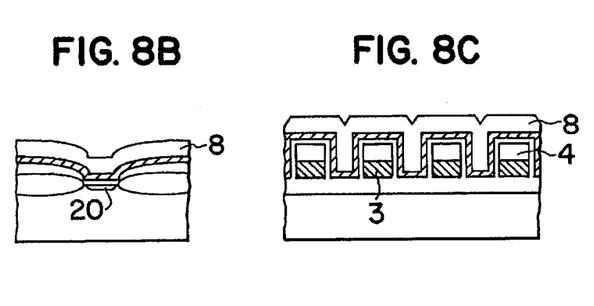
Figure 8D:
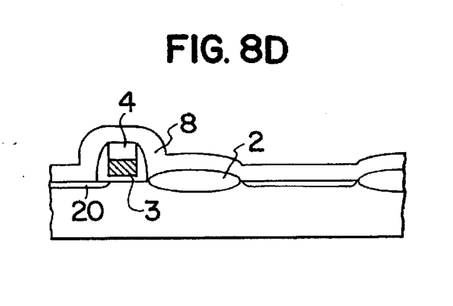
Figure 9A:
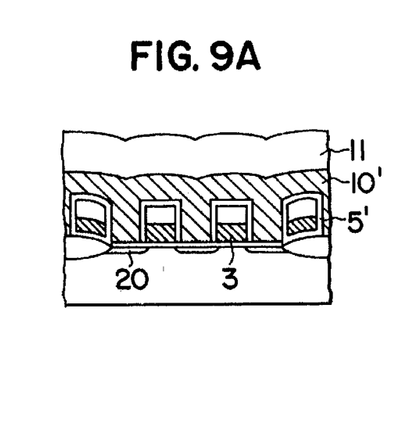
Figure 9B:
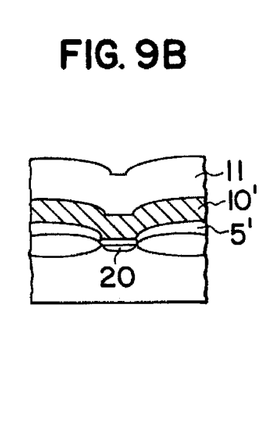
Figure 9C:
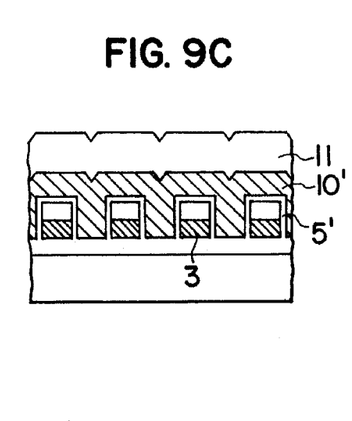
Figure 9D:
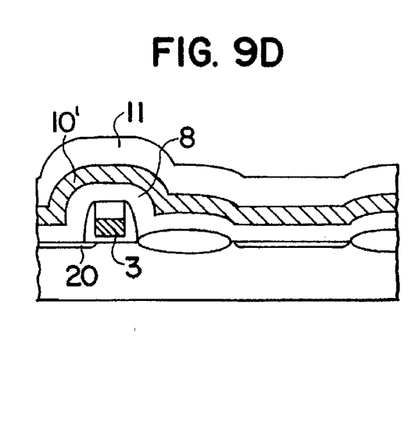
Figure 10A:
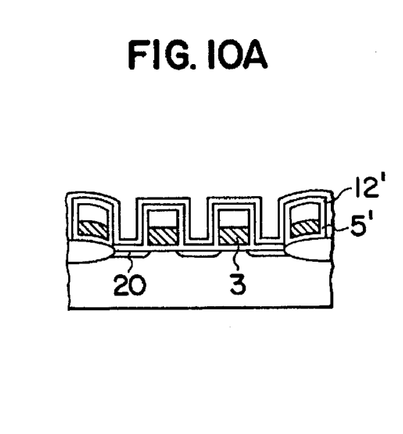
Figure 10B:
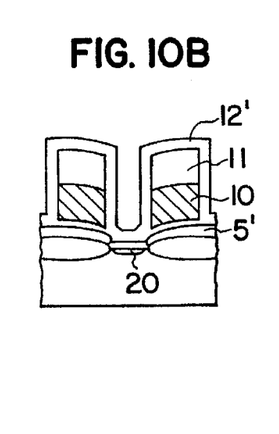
Figure 10C:
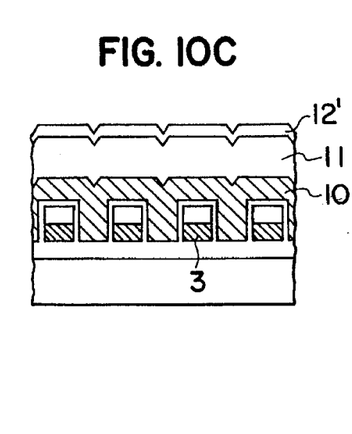
Figure 10D:
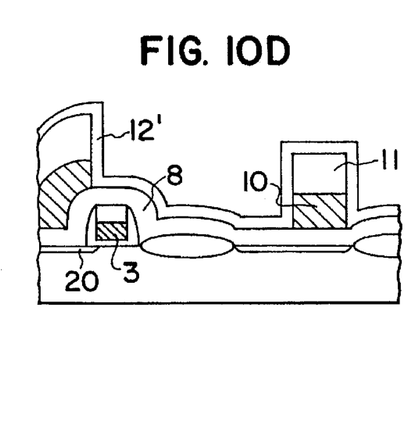
Figure 11A:
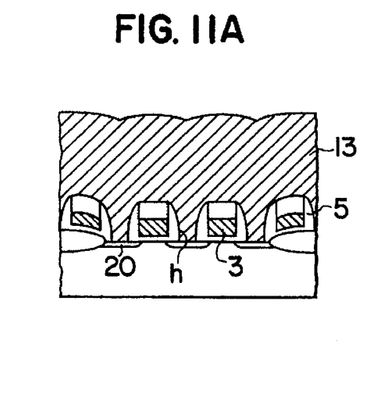
Figure 11B:
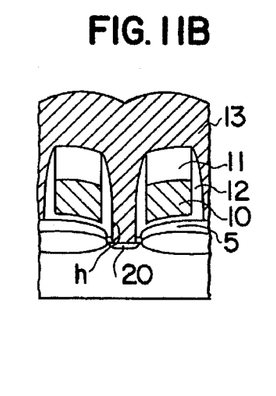
Figure 11C:
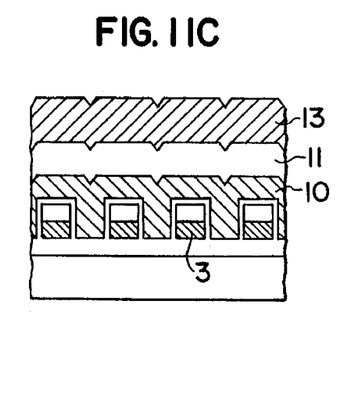
Figure 11D:
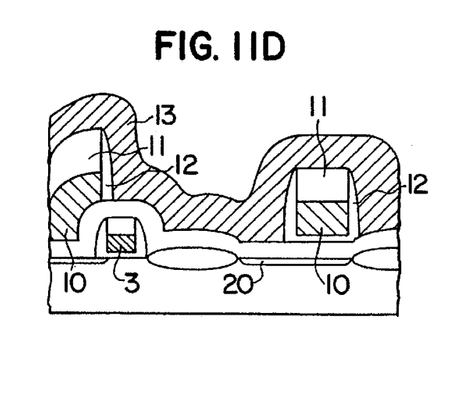
Figure 12A:
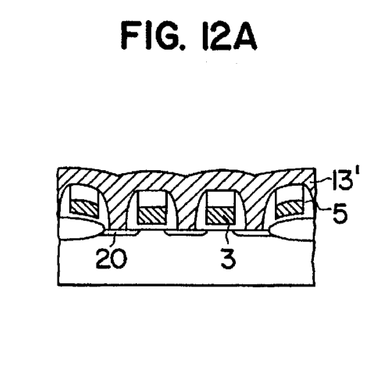
Figure 12B:
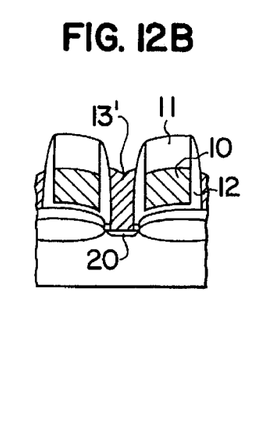
Figure 12C:
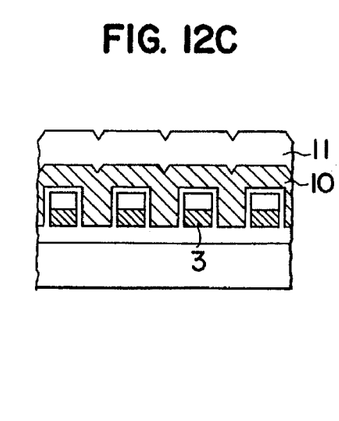
Figure 12D:
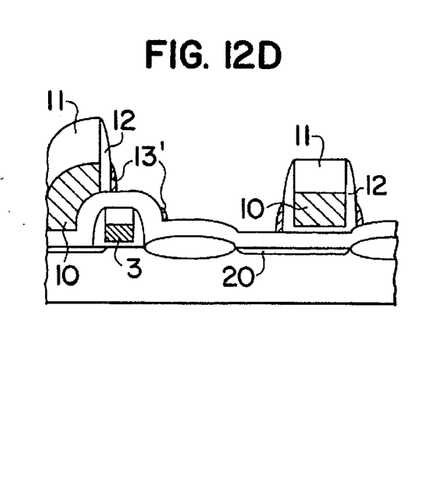
Figure 13A:
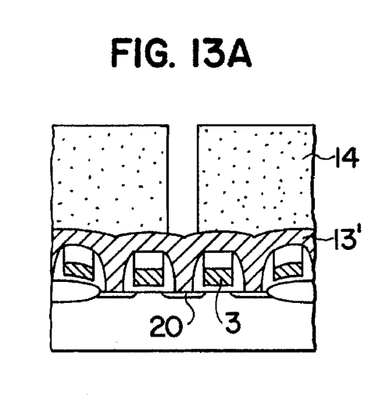
Figure 13B:
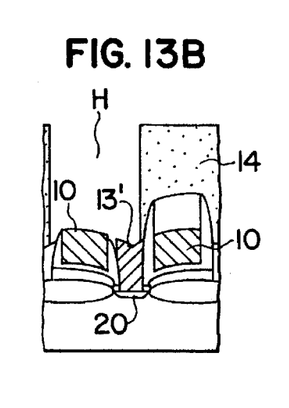
Figure 13C:
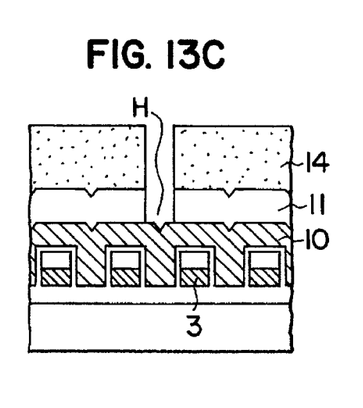
Figure 13D:
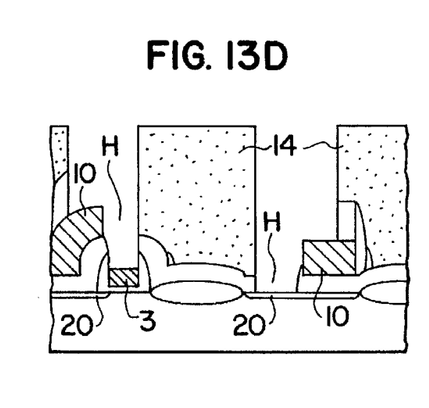
Figure 14A:
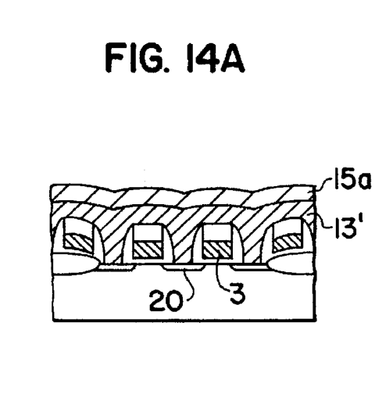
Figure 14B:
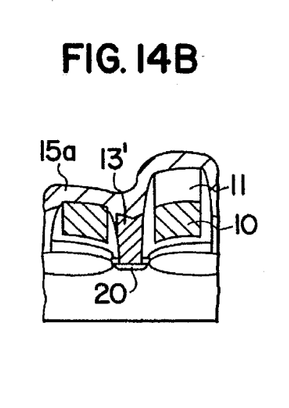
Figure 14C:
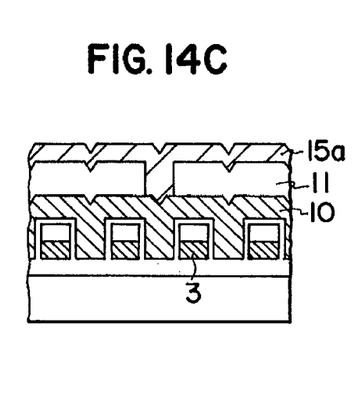
Figure 14D:
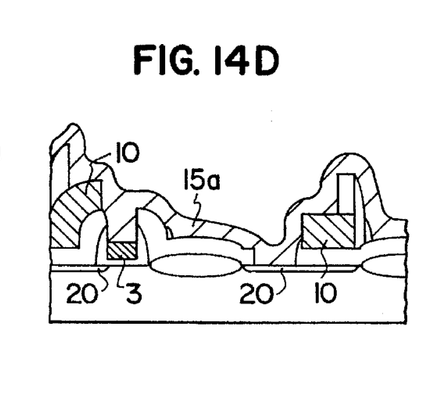
Figure 15A:
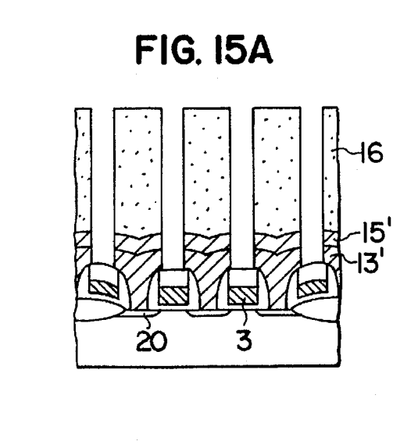
Figures 15B, 15C:
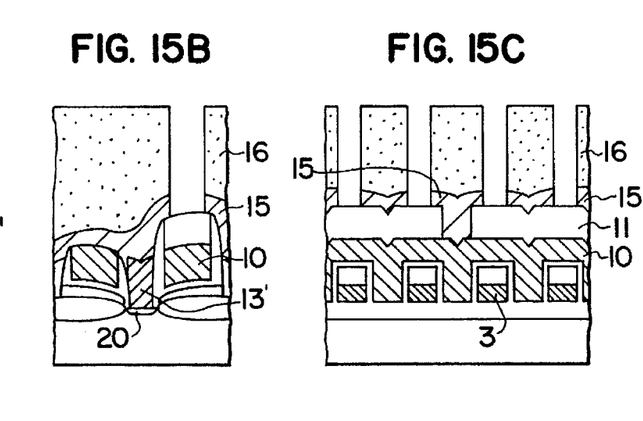
Figure 15D:
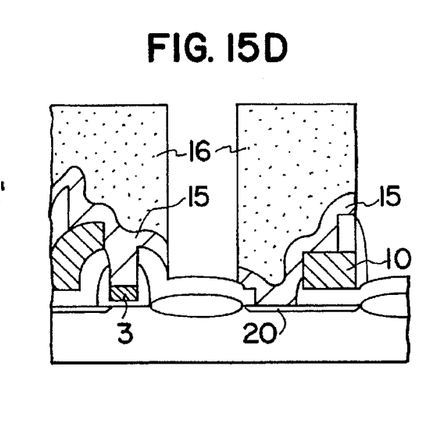
Figure 16A:
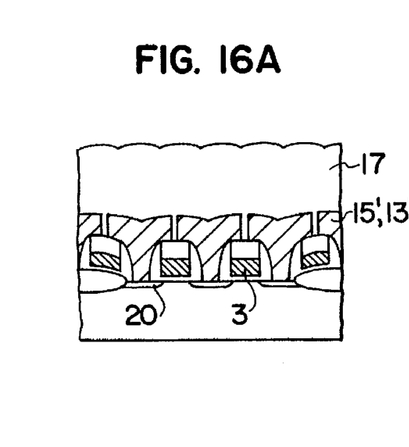
Figure 16B:
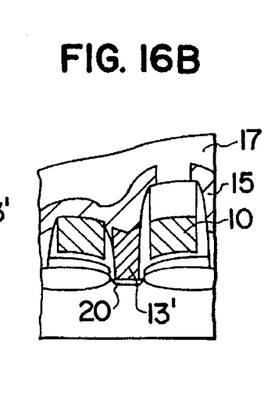
Figure 16C:
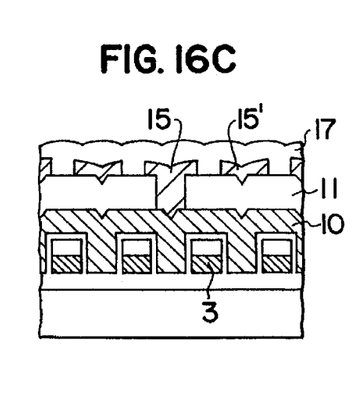
Figure 16D:
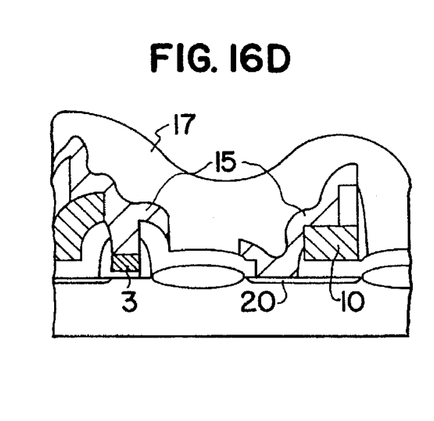
Figure 17A:
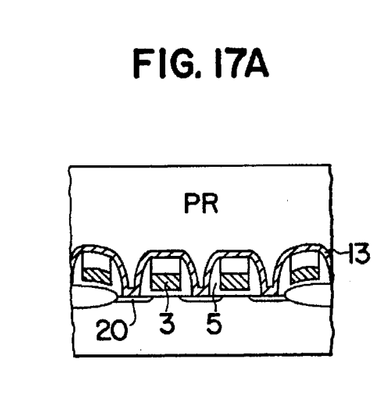
FIGS. 17A–17D, 18A–18D and 19A–19D are cross-sectional views for illustrating a method for manufacturing a semiconductor device according to another embodiment of the present invention.
Figure 17B:
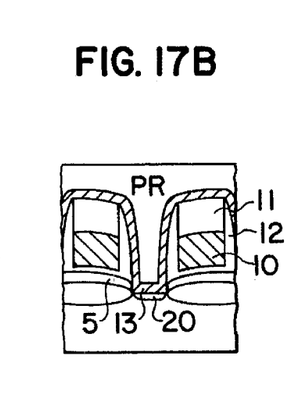
Figure 17C:
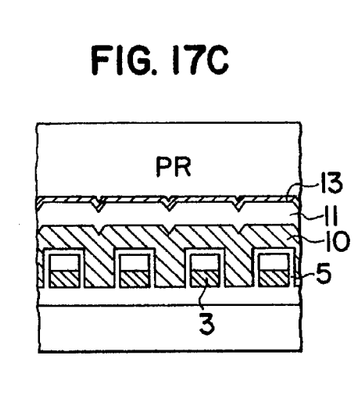
Figure 17D:
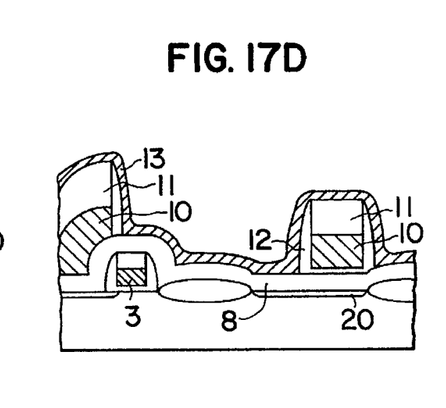

FIGS. 6A and 6B are plan views showing a semiconductor device manufactured according to the present invention. Reference symbol A indicates an active region, 3 indicates a gate electrode, 10 indicates a bitline, 13' indicates a first pad electrode, 15 indicates a second pad electrode, 15' indicates a third pad electrode, and H indicates a bitline contact.

As shown in FIGS. 6A and 6B, in the present invention, a contact (not shown) is formed on active region (A) after forming bitline 10, and first pad electrode 13', connected with active region (A) through the contact, is formed between bitlines 10. Then, after forming bitline contact H on bitline 10, second pad electrode 15 connected with bitline 10 via the bitline contact (H) and third electrode 15' also connected with first pad electrode 13' via the bitline contact (H), are simultaneously formed. Bitline 10 is connected with active region (A) through first pad electrode 13' and second pad electrode 15. Here, when bitline contact (H) is formed, first pad electrode 13' serves as an etch-blocking layer for preventing the exposure of a portion of gate electrode 3 lying under the pad. Therefore, a misalignment margin of bitline contact (H) depends not on bitline 10, but on first pad electrode 13', so that the alignment tolerance of the bitline contact (H) can be maximized.

FIGS. 7A to 7D through FIGS. 16A to 16D are cross-sectional views for illustrating a method for manufacturing a semiconductor device according to one embodiment of the present invention, wherein the "A," "B" and "C" figures are cross-sectional views of a memory cell region in a semiconductor device, taken along lines aa', bb' and cc' in FIG. 6A, respectively, and each "D" figure is a cross-sectional view of a peripheral circuit region in the same semiconductor device.

FIGS. 7A through 7D show a step of forming a gate electrode 3, a first insulating film 5' and a gate spacer 5a. A gate oxide film (not shown) is formed on a semiconductor substrate 1 wherein a field oxide film 2 is formed, and a polycrystalline silicon and an oxide are sequentially deposited on the gate oxide film. Then, the oxide and polycrystalline silicon are patterned by a lithography process, thereby forming a gate electrode 3 which is insulated by a capping oxide layer 4. Thereafter, a different insulating material, e.g., an oxide, is deposited to a thickness of 300–2000 Å on the resultant structure wherein gate electrode 3 is formed, thereby forming a first insulating film 5'. Next, an insulating material, e.g., a nitride such as a silicon nitride ($Si_3N_4$), is deposited to a thickness of 100–300 Å on first insulating film 5', thereby forming an etch-blocking layer 6. Then, a first photoresist pattern 7 is formed only on the memory cell region by applying a mask which leaves exposed a peripheral circuit region on the resultant structure wherein etch-blocking layer 6 is formed, to thereby expose the peripheral circuit region. Thereafter, etch-blocking layer 6 and first insulating film 5' which are formed in the peripheral circuit region are anisotropically etched using first photoresist pattern 7 as an etch-mask, to thereby form gate spacer 5a on the sidewalls of gate electrode 3 in the peripheral circuit region.

FIGS. 8A through 8D show a step of forming a step-differential control layer 8. After removing first photoresist pattern 7, impurity ions for forming a source/drain region of a transistor are implanted on the entire surface of the resultant structure, thereby forming active regions 20 in substrate 1, which are spaced apart from each other by gate electrode 3. Then, an insulating material, e.g., a high temperature oxide, is deposited on the resultant structure wherein active regions 20 are formed, thereby forming step-differential control layer 8 for controlling the step differential between the peripheral circuit region and the memory cell region.

FIGS. 9A through 9D show a step of forming a conductive layer 10' and a bitline capping layer 11. Here, a second photoresist pattern (not shown) is formed only on the peripheral circuit region by applying a mask which exposes only the memory cell region on the resultant structure wherein step-differential control layer 8 is formed, to thereby open the memory cell region. Thereafter, the step-differential control layer formed in the memory cell region is removed by a wet etching process, using the second photoresist pattern as an etch-mask, to thereby leave step-differential control layer 8 only in the peripheral circuit region. At this time, etch-blocking layer 6 prevents the etching of first insulating film 5' thereunder, so as to prevent exposure of the gate electrode during the wet etching process for removing the step-differential control layer of the memory cell region. Then, after removing the second photoresist pattern, etch-blocking layer 6 formed in the memory cell region is removed by a wet etching process, using the step-differential control layer remaining in the peripheral circuit region as an etch-mask. Then, a conductive material, e.g., an impurity-doped polycrystalline silicon, and a metal silicide are sequentially deposited on the resultant structure, to thereby form conductive layer 10'. Then, an insulating material, e.g., an oxide, is deposited to a thickness of 300–5,000 Å on conductive layer 10', thereby forming bitline capping layer 11.

FIGS. 10A through 10D show a step of forming a bitline 10 and a second insulating film 12'. Bitline capping layer 11 and conductive layer 10' are patterned by applying a mask for forming a bitline on the resultant structure wherein bitline capping layer 11 is formed. As a result, bitline 10, whose top surface is insulated by bitline capping layer 11, is formed. Here, bitline capping layer 11 insulates bitline 10 and a second pad electrode which will be formed in a subsequent process. Thereafter, an insulating material, e.g., an oxide, is deposited to a thickness of 300–3000 Å on the resultant structure wherein bitline 10 is formed, thereby forming second insulating film 12'. A material which has the same or a similar etch rate as that of the material constituting first insulating film 5' with respect to any anisotropic etching process is used form second insulating film 12'. In the present embodiment, an oxide film is used as first and second insulating film 5' and 12'.

FIGS. 11A through 11D show a step of forming a second spacer 12, a contact (h) and a first pad electrode 13. Second insulating film 12' is anisotropically etched, to thereby form second spacer 12 composed of second insulating film on the sidewalls of bitline 10. At this time, first insulating film 5' under bitline 10 is also etched during the above anisotropic etching process, to thereby form a first spacer 5 composed of first insulating film on the sidewalls of gate electrode 3 formed in the memory cell region. Also, the gate oxide film on active region 20 formed in the memory cell region is also etched during the above anisotropic etching process, to thereby form contact (h) which exposes a portion of active region 20 of the memory cell region in self-alignment. Thereafter, a conductive material, e.g., an impurity-doped polycrystalline silicon, is deposited to a thickness of 200–10,000 Å on the resultant structure wherein contact (h) is formed, thereby forming first pad electrode 13. First pad electrode 13 is connected with active region 20 of the memory cell region through contact (h). Here, if first pad electrode 13 is formed to a thickness equal to the distance between bitlines 10, a gap which exists between bitlines 10 is filled with first pad electrode 13, so that an interface thereof is planarized to some degree. For example, when the distance between bitlines 10 is 0.4 μm, if an impurity-doped polycrystalline silicon which is used as first pad electrode 13 is deposited to a thickness over 0.2 μm, the gap between bitlines 10 is filled in a relatively planar manner (refer to FIG. 11B).

FIGS. 12A through 12D show a step of etching back first pad electrode 13 using bitline capping layer 11 as an etch end point. At this time, if the first pad electrode is over-etched, the first pad electrode is completely removed where the step differential is severe in the peripheral circuit region. In the memory cell region, bitline capping layer 11 is exposed and the step differential of gate electrode 3 and bitline 10 become merged between bitlines 10, so that a residue of first pad electrode 13' remains (refer to FIG. 12B). Here, the degree of the above over-etching should be less than the height of bitline 10, because first pad electrode 13' should also be left on gate electrode 3 of the memory cell region (refer to FIG. 12A). Therefore, the first pad electrode 13' may be over-etched so that no first pad electrode is left on the bitline capping layer 11, the gate electrode, and the active region of the peripheral circuit region whereon a bitline contact will be formed in a subsequent process. At this time, first pad electrode 13' which is left on gate electrode 3 of the memory cell area serves as an etch-blocking layer for preventing the exposure of the gate electrode thereunder, when a bitline contact is formed in a subsequent process.

FIGS. 13A through 13D show a step of forming a bitline contact H. A photoresist (not shown) is coated on the resultant structure and exposed. Then, the photoresist is developed by applying a mask for forming a bitline contact, to thereby form a third photoresist pattern 14 which exposes a region where the bitline contact will be formed. Thereafter, the layers stacked on the region where the bitline contact will be formed are etched using third photoresist pattern 14 as an etch-mask, thereby forming bitline contact H on bitline 10. Here, in the memory cell region, the layout of bitline contact H is large so as to encompass bitline 10 (refer to FIG. 6B). Also, unlike the conventional method described in FIGS. 1, 2 and 3, large bitline contacts can be formed and laid out in a straight line, since the overlapping region between bitline 10 and bitline contact H is unnecessary. Therefore, when the overlapping of the bitline and bitline contact is considered, the misalignment margin is insufficient in the conventional method. However, in the present invention, the bitline contact is formed on the bitline, so that this margin is maximized.

FIGS. 14A through 14D show a step of forming a first conductive layer 15a. After removing third photoresist pattern 14, a conductive material, e.g., an impurity-doped polycrystalline silicon, is deposited to a thickness of 100–5000 Å on the resultant structure, thereby forming first conductive layer 15a.

FIGS. 15A through 15D show a step of forming a second pad electrode 15 and a third pad electrode 15'. A photoresist is coated on the resultant structure wherein first conductive layer 15a is formed. Then, the photoresist is exposed and developed, to thereby form a fourth photoresist pattern 16. Thereafter, first conductive layer 15a is anisotropically etched, using fourth photoresist pattern 16 as an etch-mask, to thereby form second pad electrode 15 connected via bitline contact H with bitline 10 and with active region 20 of the peripheral circuit region, and to thereby form third pad electrode 15' connected with active region 20 of the memory cell region through first pad electrode 13'. Therefore, first pad electrode 13' plays the role of bridging active region 20 with bitline 10. Second pad electrode 15 is formed on bitline 10, so that the misalignment margin of bitline contact H is secured. Also, third pad electrode 15' serves as a pad for forming a storage-node contact for connecting a capacitor storage node, which will be formed in a subsequent process, with active region 20. At this time, first pad electrode 13' is also etched during the anisotropic etching process of first conductive layer 15a, so that a stringer-type pad electrode (refer to FIG. 12D), which may remain where a severe step differential of the peripheral circuit region exists, is completely removed during the etch-back process of the first pad electrode of FIG. 12.

FIGS. 16A through 16D show a step of forming an interlayer planarizing layer 17. An insulating material, e.g., a BPSG, is deposited to a thickness of 3,500 Å on the resultant structure wherein second and third pad electrodes 15 and 15' are formed and is reflowed at a high temperature, thereby forming interlayer planarizing layer 17. Here, as the thicknesses of second and third pad electrodes 15 and 15' are increased, the pad electrode is planarized, so that interlayer planarizing layer 17 formed by the BPSG reflow process can be replaced with an insulating film of a different kind. In this case, since a high temperature process such as BPSG reflow is skipped, increased device integration is facilitated. Then, though not shown, interlayer planarizing layer 17 is selectively etched by a lithography process, thereby forming a storage-node contact on third pad electrode 15'.

According to the above-described embodiment of the present invention, after forming the second spacer on the sidewalls of the bitline to thereby form a contact which is self-aligned to the active region, the first pad electrode which bridges the active region with the bitline through the contact is formed. Then, after forming the bitline contact on the bitline, the second and third pad electrodes, which are each connected with the bitline and the first pad electrode through the bitline contact, are simultaneously formed. Therefore, the misalignment margins of the bitline contact and the storage-node contact depend not on the bitline, but on the sizes of the second and third pad electrodes. As a result, the alignment tolerances of the bitline contact and the storage-node contact can be maximized. Also, since the gate electrode and the bitline capping layer are used as an etch-blocking layer during the formation of the first pad electrode, damage to the active region can be prevented, regardless of the field oxide film size. Also, the first pad electrode, which may remain in the peripheral circuit region as a stringer-type electrode after the etch-back process of the first pad electrode, is completely removed during the subsequent anisotropic etching process for forming the second and third pad electrodes, so that a reliable semiconductor device can be realized.

FIGS. 17A to 17D through FIGS. 19A to 19D are cross-sectional views for illustrating a method for manufacturing a semiconductor device according to another embodiment of the present invention.

Referring to FIGS. 17A through 17D, a conductive material, e.g., an impurity-doped polycrystalline silicon, is thinly deposited on the resultant structure wherein first and second spacers 5 and 12 are formed by the method described with respect to FIGS. 7 through 10, thereby forming a first pad electrode 13. Thereafter, a photoresist (not shown) is coated on first pad electrode 13, and then, a photoresist pattern (PR) is left only on the memory cell by a lithography process.

Figure 18A:
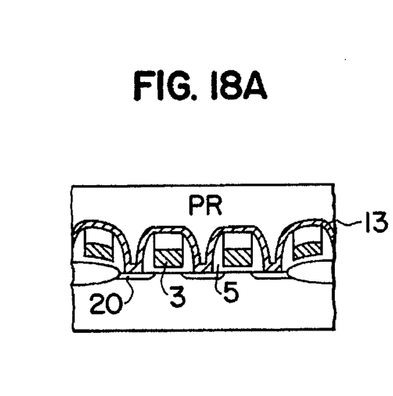
Figure 18B:
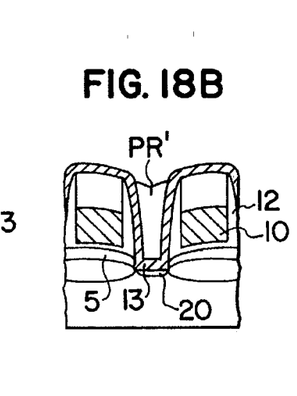
Figure 18C:
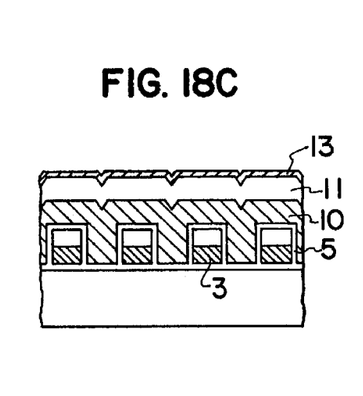
Figure 18D:
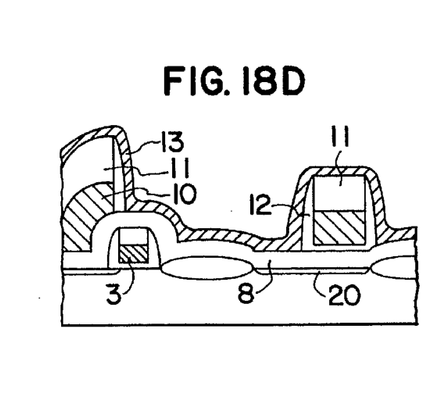

Referring to FIGS. 18A through 18D, the photoresist pattern (PR) is etched back, to thereby leave photoresist pattern portion (PR') only between bitlines 10 (refer to FIG. 18B). At this time, the photoresist pattern on bitline 10 is removed, so that first pad electrode 13 thereunder is exposed (refer to FIG. 18C).

Figure 19A:
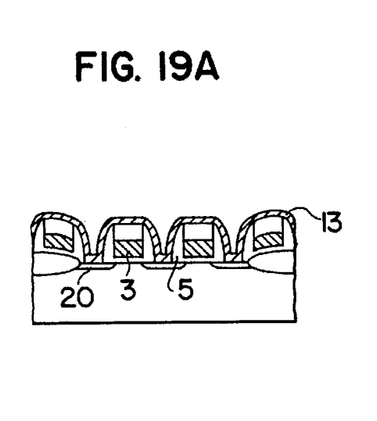
Figure 19B:
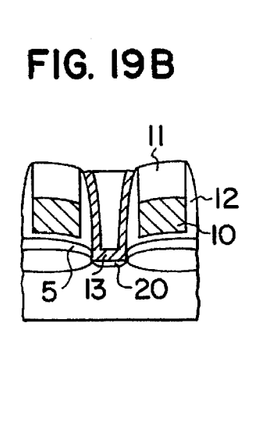
Figure 19C:
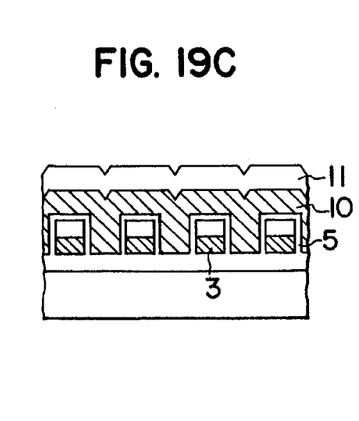
Figure 19D:
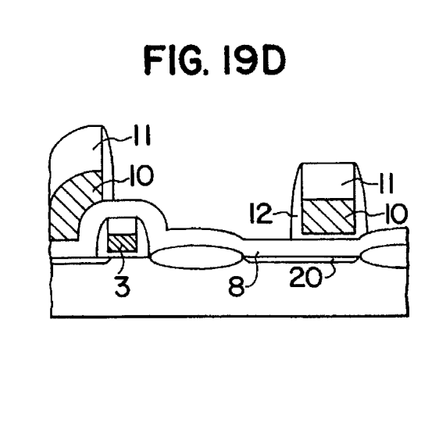

Referring to FIGS. 19A through 19D, first pad electrode 13 is etched using photoresist pattern PR' as an etch-mask, so that bitline capping layer 11 thereunder is exposed (refer to FIG. 19C). Therefore, after leaving first pad electrode 13 only between bitlines 10 (refer to FIG. 19B), the same steps described above with respect to FIGS. 12 through 16 are performed.

According to the above-described second embodiment of the present invention, in cases where the gap between bitlines cannot be filled by the first pad electrode due to the difficulty in increasing the thickness of the first pad electrode, the first pad electrode can be left between the bitlines by filling the gap with a material such as photoresist. Here, a material which has an etch rate different from that of the material constituting the first pad electrode with respect to any anisotropic etching process is used instead of photoresist.

According to the present invention as described above, since the pad electrode is formed after forming the bitline, the gate electrode and the bitline shield the majority of the field oxide film and active region to thereby eliminate the dependency of the first pad electrode with respect to a size of the field oxide film. Also, when the first pad electrode is formed, since the gate electrode and bitline thereunder are used as an etch-blocking layer, damage to the active region can be effectively prevented.

Moreover, the second pad electrode, which is connected with the bitline through the bitline contact, and the third pad electrode, which is a pad for forming the storage-node contact and is connected with the first pad electrode through the bitline contact, are simultaneously formed on the bitline, so that the misalignment margins of the bitline contact and the storage-node contact depend not on the bitline, but on the sizes of the second and third pad electrodes. Therefore, the alignment tolerances of the bitline contact and the storage-node contact are maximized, and thus, a reliable semiconductor device can be realized.

It will be understood by those skilled in the art that the foregoing description is a preferred embodiment of the disclosed device and that various changes and modifications may be made in the invention without departing from the spirit and scope thereof.

What is claimed is:

1. A method for manufacturing a semiconductor memory device comprising the steps of:

forming gate electrodes on a semiconductor substrate;

forming active regions in said semiconductor substrate, respective pairs of active regions being spaced apart from each other one said gate electrode;

forming a first insulating film on the resultant structure having said active regions;

forming bitlines on said first insulating film;

forming a second insulating film on said bitlines;

forming a first spacer and a second spacer composed of said first insulating film and second insulating film, respectively, on the sidewalls of said gate electrodes and said bitlines, respectively, and, simultaneously forming a self-aligned contact over said active regions;

depositing a first conductive material on the resultant structure wherein said contact is formed, and etching said first conductive material, to thereby form a first pad electrode which is electrically connected with said active region between said bitlines;

forming a bitline contact on said bitlines; and depositing a second conductive material on the resultant structure wherein said bitline contact is formed, and patterning said second conductive material by a lithography process to thereby form a second pad electrode connected with said bitline via the bitline contact and a third pad electrode connected with said first pad electrode via the bitline contact.

2. A method for manufacturing a semiconductor device as claimed in claim 1, wherein said bitlines and said gate electrodes are used as an etch-blocking layer in said step of forming said first pad electrode.

3. A method for manufacturing a semiconductor device as claimed in claim 1, wherein in said step of forming said first and second spacers on the sidewalls of said gate electrodes and said bitlines, said first insulating film is also etched when said second spacer is formed on the sidewalls of said bitlines by anisotropically etching said second insulating film, so that said first spacers are formed on the sidewalls of said gate electrodes.

4. A method for manufacturing a semiconductor device as claimed in claim 1, wherein the layout size of said bitline contact is larger than that of said active region which will be connected with said bitline.

5. A method for manufacturing a semiconductor device as claimed in claim 1, wherein said bitlines lie along substantially one direction.

6. A method for manufacturing a semiconductor device as claimed in claim 1, wherein said first conductive material is formed to a thickness equal to the distance between adjacent said bitlines.

7. A method for manufacturing a semiconductor device as claimed in claim 1, wherein after said step of forming said second and third pad electrodes, the method further comprises the steps of:

forming a third insulating film on the resultant structure;

partially etching said third insulating film, to thereby form a storage-node contact on said third pad electrode; and forming a capacitor storage node connected with said third pad electrode through said storage-node contact on the resultant structure.

* * * * *